(12) United States Patent
Yang et al.

(10) Patent No.: US 7,727,888 B2
(45) Date of Patent: Jun. 1, 2010

(54) INTERCONNECT STRUCTURE AND METHOD FOR FORMING THE SAME

(75) Inventors: Chih-Chao Yang, Poughkeepsie, NY (US); Louis C. Hsu, Fishkill, NY (US); Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 324 days.

(21) Appl. No.: 11/216,198

(22) Filed: Aug. 31, 2005

(65) Prior Publication Data

US 2007/0049007 A1    Mar. 1, 2007

(51) Int. Cl.
*H01L 29/41* (2006.01)
*H01L 21/44* (2006.01)

(52) U.S. Cl. ............ 438/665; 257/773; 257/774; 257/E23.145; 257/E21.627; 438/639; 438/640; 438/964

(58) Field of Classification Search .......... 257/E21.578, 257/739, 773–774, E23.142–E23.145; 438/637–640, 438/620, 622–625, 627–630, 642–643, 665, 438/963–964
See application file for complete search history.

(56) References Cited

U.S. PATENT DOCUMENTS

| | | | |
|---|---|---|---|
| 4,184,909 A | | 1/1980 | Chang et al. |
| 4,888,087 A | * | 12/1989 | Moslehi et al. .............. 438/629 |
| 5,427,827 A | * | 6/1995 | Shing et al. .................. 427/577 |
| 5,933,753 A | | 8/1999 | Simon et al. |
| 5,985,762 A | | 11/1999 | Geffken et al. |
| 6,169,010 B1 | * | 1/2001 | Higashi ....................... 438/396 |
| 6,429,519 B1 | | 8/2002 | Uzoh |
| 6,485,618 B2 | * | 11/2002 | Gopalraja et al. ...... 204/192.17 |
| 6,605,532 B1 | * | 8/2003 | Parekh et al. ................ 438/637 |
| 6,613,664 B2 | * | 9/2003 | Barth et al. .................. 438/629 |
| 6,616,855 B1 | * | 9/2003 | Chen et al. ..................... 216/38 |
| 6,642,146 B1 | * | 11/2003 | Rozbicki et al. ............. 438/687 |
| 6,649,531 B2 | * | 11/2003 | Cote et al. ................... 438/714 |
| 6,784,105 B1 | * | 8/2004 | Yang et al. ................... 438/687 |
| 6,878,615 B2 | * | 4/2005 | Tsai et al. .................... 438/618 |
| 7,135,402 B2 | * | 11/2006 | Lin et al. ..................... 438/639 |
| 7,192,871 B2 | * | 3/2007 | Maekawa et al. ............ 438/695 |

(Continued)

OTHER PUBLICATIONS

Yang, C.C., et al. "Extendability of PVD Barrier/Seed for BEOL Cu Metallization." Proceedings of the 2005 IEEE International Interconnect Technology Conference (Jun. 6-8, 2005): pp. 135-137.*

(Continued)

*Primary Examiner*—Matthew W Such
(74) *Attorney, Agent, or Firm*—Brian Verminski; Hoffman Warnick LLC (57) ABSTRACT

An interconnect structure and a method for forming the same are described. Specifically, under the present invention, a gouge is created within a via formed in the interconnect structure before any trenches are formed. This prevents the above-mentioned trench damage from occurring. That is, the bottom surface of the trenches will have a roughness of less than approximately 20 nm, and preferably less than approximately 10 nm. In addition to the via, gouge and trench(es), the interconnect structure of the present invention includes at least two levels of metal wiring. Further, in a typical embodiment, the interconnect structure utilizes any dielectrics having a dielectric constant no greater than approximately 5.0.

14 Claims, 12 Drawing Sheets

U.S. PATENT DOCUMENTS

| | | | |
|---|---|---|---|
| 7,196,002 B2* | 3/2007 | Su et al. | 438/618 |
| 2003/0011076 A1* | 1/2003 | Seo et al. | 257/775 |
| 2003/0077897 A1* | 4/2003 | Tsai et al. | 438/633 |
| 2003/0166345 A1* | 9/2003 | Chang | 438/717 |
| 2004/0166666 A1* | 8/2004 | Usami | 438/629 |
| 2005/0106847 A1* | 5/2005 | Hiruta et al. | 438/585 |
| 2005/0112864 A1* | 5/2005 | Clevenger et al. | 438/622 |
| 2005/0173799 A1* | 8/2005 | Jou et al. | 257/751 |
| 2006/0160362 A1* | 7/2006 | Huang et al. | 438/700 |
| 2006/0172530 A1* | 8/2006 | Cheng et al. | 438/637 |
| 2007/0202689 A1 | 8/2007 | Choi et al. | |

OTHER PUBLICATIONS

Liang, Mong-Song, "Challenges in Cu/Low-K Integration," IEEE Int. Electron Devices Meeting, Jan. 2004, IEEE Publication No. 0-7803-8684-1/04.

Edelstein, D. et al., "Comprehensive Reliability Evaluation of a 90 nm CMOS Technology with Cu/PECVD Low-K BEOL," IEEE Int. Reliability Physics Symposium 2004.

* cited by examiner

INTERCONNECT STRUCTURE AND METHOD FOR FORMING THE SAME

BACKGROUND OF THE INVENTION

1. Field of the Invention

The present invention generally relates to an interconnect structure and method for forming the same. Specifically, among other things, the present invention provides an interconnect structure in which a gouge can be formed in a via of the interconnect structure without causing trench damage.

2. Related Art

As millions of devices and circuits are squeezed onto a semiconductor chip, the wiring density and the number of metal levels are increased generation after generation. In order to provide low RC for high signal speed, low-k dielectric and copper lines become necessary. The quality of thin metal wirings and studs formed by the Damascene process is extremely important to ensure yield and reliability. One major problem encountered in this area today is poor mechanical integrity of deep submicron metal studs embedded in low-k dielectric, which can cause unsatisfied thermal cycling and stress migration resistance in BEOL interconnects.

To solve this weak mechanical strength issue while employing copper Damascene and low-k dielectric in the Back End of the Line (BEOL), a so called "via punch-through" or gouging technique has been adopted by the semiconductor industry. Such a via-gouging feature was reported to achieve a reasonable contact resistance. It also increases the mechanical strength of the contact studs. However, the gaseous (e.g., Argon) sputtering that is often used to create gouging also causes roughness at the bottom of the trench(es) formed in the low-k material. Such damage becomes a major yield detractor and reliability concern. This problem becomes more severe when ultra low-k (ULK) dielectric material is used (e.g., porous low-k dielectrics).

Figure 1A:
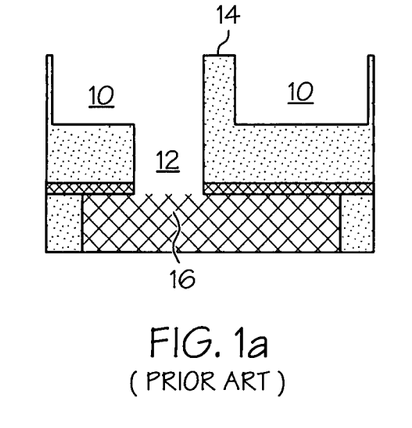
FIGS. 1a-e depict the formation of an interconnect structure according to the prior art.

Specifically, after contact and wire patterning is performed using the dual Damascene process, a common pre-cleaning step to remove native copper oxide is an non-selective, directional argon sputtering. It is recommended to use aggressive Argon bombardment to create the via-gouging feature. An undesirable side-effect of Argon bombardment is damage to the bottom of the trenches. Referring to FIG. 1a, after Dual Damascene patterning, both wiring 10 and via 12 patterns are formed in the low-k dielectric layer 14. At this point, a bottom level of metal wiring 16 (e.g., copper) is revealed.

Figure 1B:
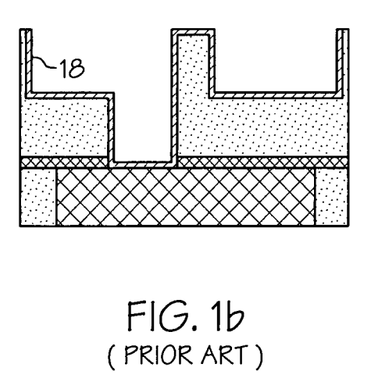
Figure 1C:
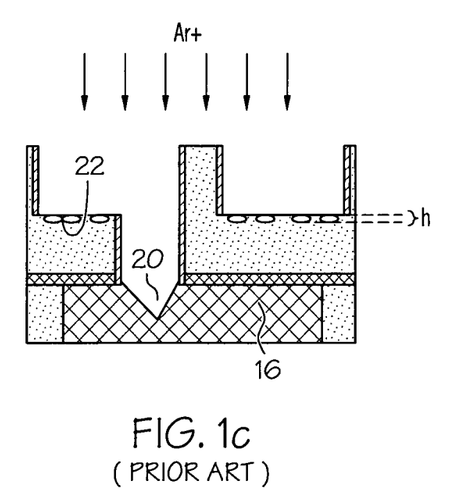
Figure 1D:
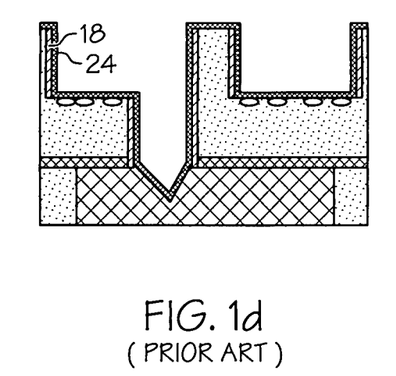
Figure 1E:
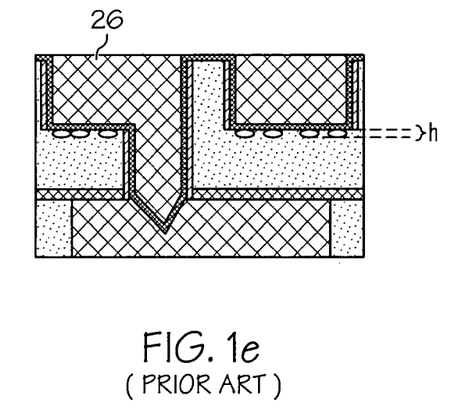

As shown in FIG. 1b, after feature surfaces are coated with a liner material 18, Argon sputtering is carried out to clean the surface of the structure and form a gouge 20 into level of metal wiring 16 to enhance the interconnect mechanical strength. At this point, as shown in FIG. 1c, damage 22 is exhibited at the bottom of the trenches 10 due to the effect of aggressive sputtering. In general, the damage layer depth "h" is >20 nm. Irrespective of this damage, the prior practice has been to continue the process as shown in FIG. 1d by depositing liner 24, and then to perform metallization and Chemical-Mechanical Polishing (CMP) to produce level of metal wiring 26 as shown in FIG. 1e.

This feature-bottom-roughness damage 22 exhibited by this practice reduces the diffusion barrier quality and degrades the overall wiring reliability or produces a high-level of metal-to metal leakage. It is believed that during argon sputtering not only damages the low-k material, but also sputters copper and metallic liner material which eventually embedded inside the roughened surface regions.

Figure 2A:
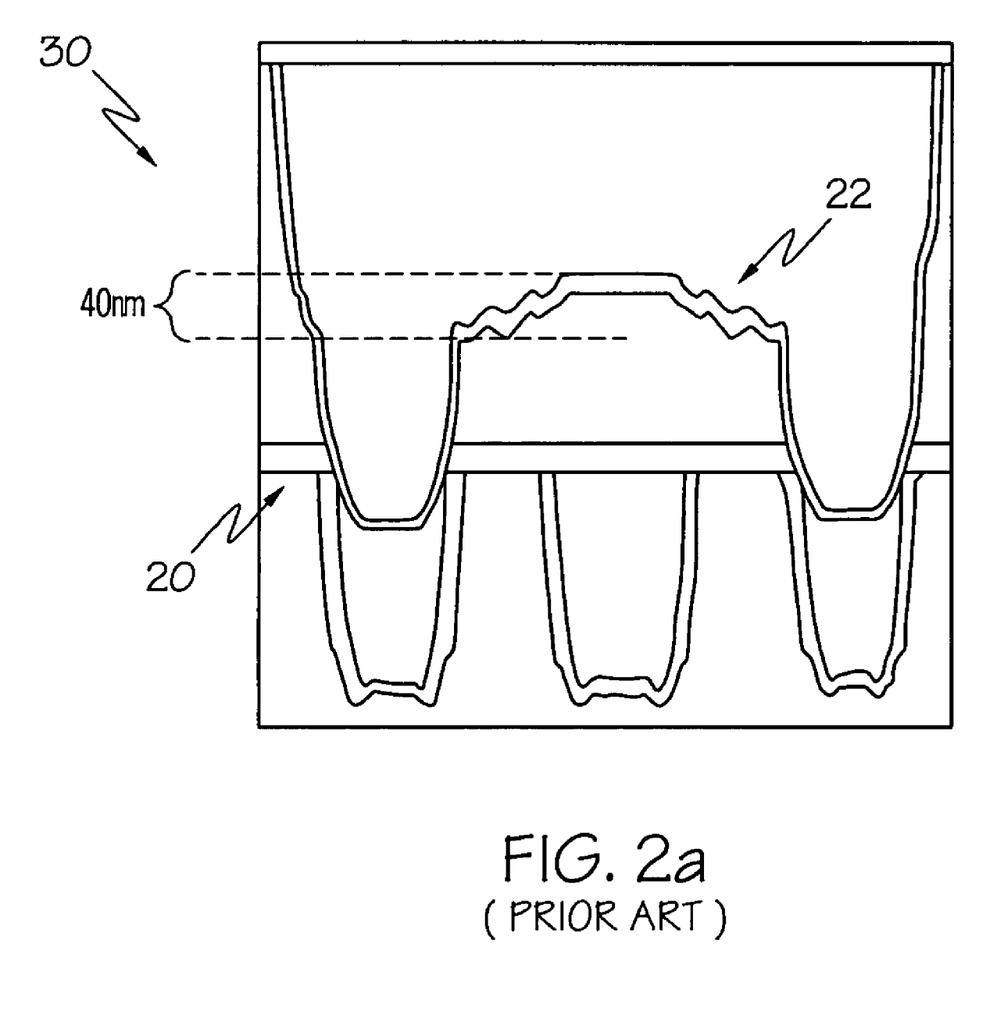
FIG. 2a depicts a SEM cross-sectional diagram of BEOL device with copper interconnects in dense low-k dielectric according to the prior art.
Figure 2B:
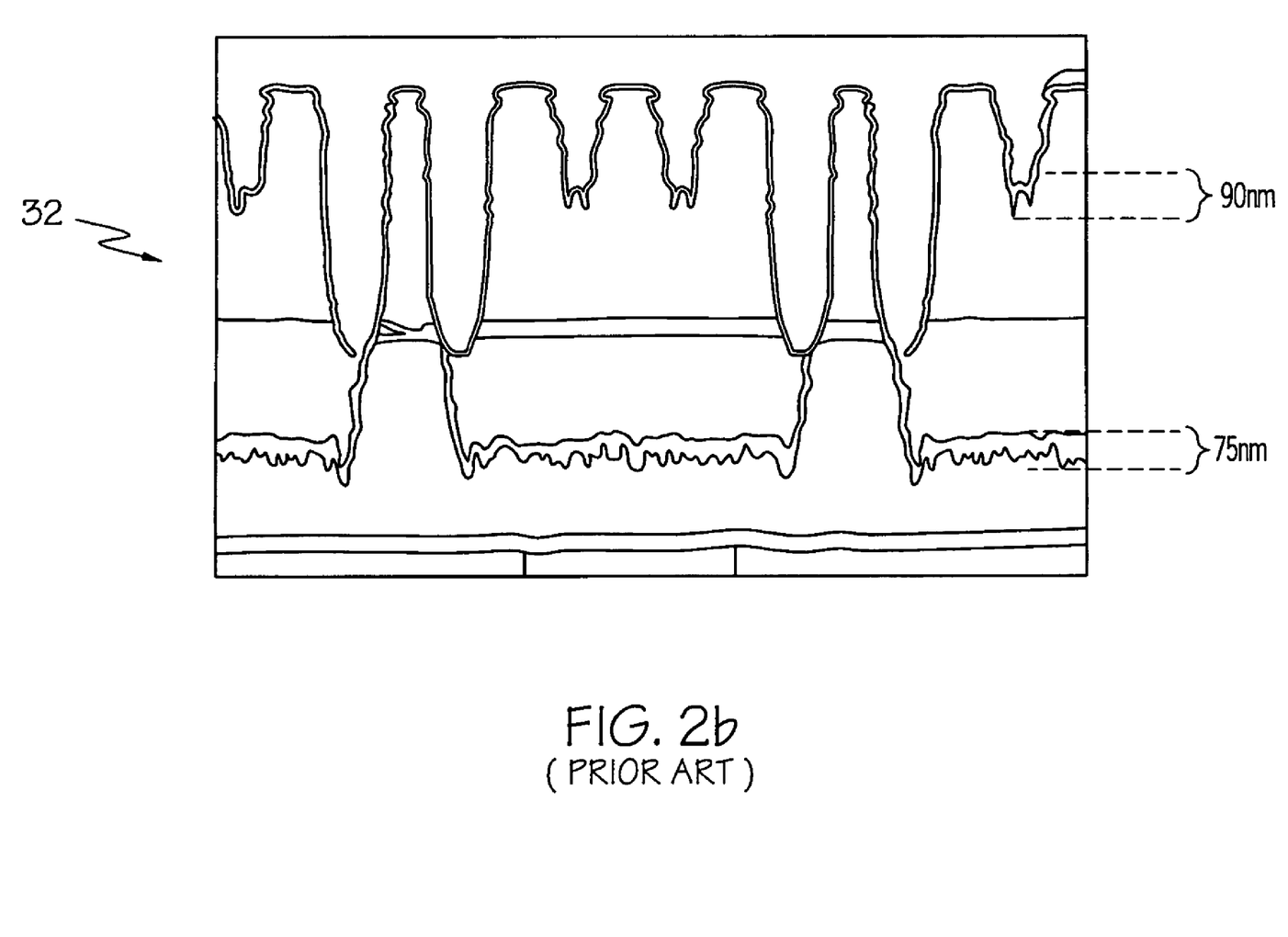
FIG. 2b depicts a SEM cross-sectional diagram of a BEOL device with copper interconnects in an ultra low-k dielectric according to the prior art.

A SEM cross-sectional diagram 30 of the BEOL with copper interconnects in dense low-k dielectric is shown in FIG. 2a. Specifically, diagram 30 shows feature-bottom-roughness damage 22 of approximately 40 nm. A ULK dielectric has been adopted as a BEOL inter-level-dielectric material in most advanced semiconductor products. As compared to dense low-k ILD, the damage impact of gaseous bombardment is much higher on most ULK dielectrics, which makes integration of the current metallization approach with ULK dielectrics impossible. A SEM cross-sectional diagram 32 of the BEOL with copper interconnects in a ULK dielectric is shown in FIG. 2b. As can be seen, the damage in a ULK dielectric (e.g., approximately 90 nm) is even higher than the low-k dielectric of FIG. 2a.

SUMMARY OF THE INVENTION

In general, the present invention provides an interconnect structure and a method for forming the same. Specifically, under the present invention, a gouge is created through a via formed in the interconnect structure before any trenches are formed. This prevents the above-mentioned trench damage from occurring. That is, the bottom surface of the trenches will have a roughness of less than approximately 20 nm, and preferably less than approximately 10 nm. In addition to the via, gouge and trench(es), the interconnect structure of the present invention includes at least two levels of metal wiring. Further, in a typical embodiment, the interconnect structure utilizes any dielectrics having a dielectric constant no greater than approximately 5.0. Other novel features of the interconnect structure of the present invention will be further described below in the Detailed Description of the Invention.

A first aspect of the present invention provides a method for preventing trench damage during formation of an interconnect structure, comprising: forming a dielectric layer having a first level of metal wiring interconnect embedded therein; forming a second dielectric layer above the first dielectric layer; forming a via in the second dielectric layer and in contact with the level of metal wiring; forming a gouge under the via and into the first level of metal wiring; forming a trench in the second dielectric layer after the gouge has been formed.

A second aspect of the present invention provides a method for forming an interconnect structure, comprising: forming a first level of metal wiring in a first dielectric layer; forming a capping layer over the first dielectric layer; forming a second dielectric layer over the capping layer; applying a mask layer over the second dielectric layer; forming a via through the mask, the second dielectric layer and the capping layer; forming a gouge in the via; and forming a trench in the second dielectric layer after the gouge has been formed;

A third aspect of the present invention provides an interconnect structure comprising: a plurality of levels of metal wiring; a via having a gouge; and at least one trench, a bottom surface of each of the at least one trench having a roughness of less than approximately 20 nm.

A fourth aspect of the present invention provides an interconnect structure, comprising: a first level of metal wiring embedded within a first dielectric layer; a capping layer over the first dielectric layer; a second dielectric layer over the capping layer; a via formed in the second dielectric layer, the via having a gouge formed into the first level of metal wiring; at least one trench formed in the second dielectric layer; and a second level of metal wiring formed in the via, the gouge and the at least one trench, the via having sidewalls that are lined with a liner layer that is not present in the gouge or the at least one trench.

Therefore the present invention provides an interconnect structure and method for forming the same.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, the present invention provides an interconnect structure (in a semiconductor device) and a method for forming the same. Specifically, under the present invention, a gouge is created through a via formed in the interconnect structure before any trenches are formed. This prevents the above-mentioned trench damage from occurring. That is, the bottom surface of the trenches will have a roughness of less than approximately 20 nm, and preferably less than approximately 10 nm. In a typical embodiment, the interconnect structure utilizes any dielectrics having a dielectric constant no greater than approximately 5.0.

Figure 3:
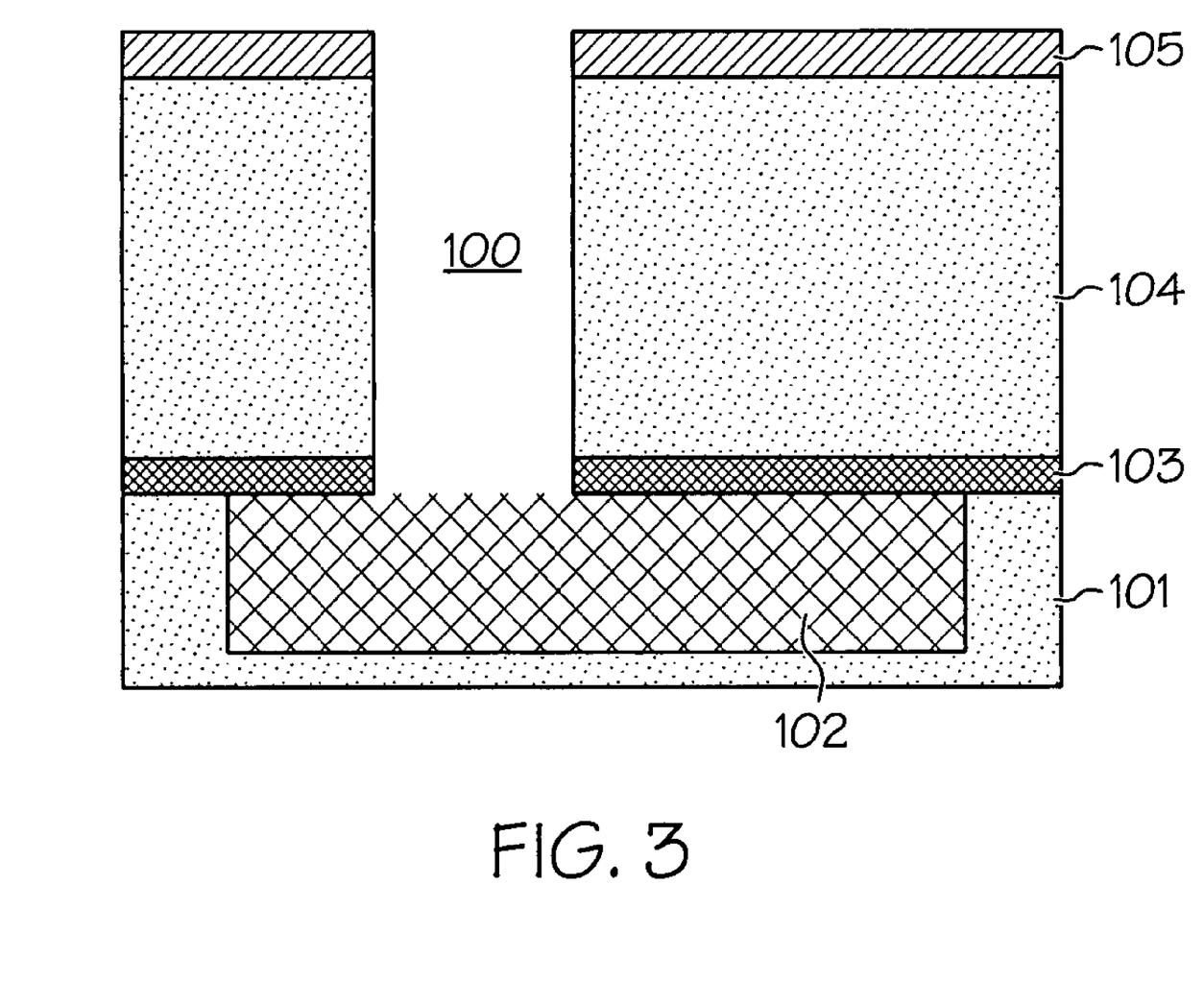
FIGS. 3-11 depict the formation of an interconnect structure according to the present invention.

The formation of the interconnect structure of the present invention will now be described in greater detail in conjunction with FIGS. 3-11. The structure shown in FIG. 3 is fabricated using interconnect techniques that are well known in the art. Specifically, a wafer (not shown) including various semiconductor devices (not shown) is first formed utilizing conventional semiconductor device processing steps (e.g., complementary metal oxide semiconductor (CMOS) device fabrication). In any event, as shown, a first dielectric layer 101 (e.g., $SiO_2$, $Si_3N_4$, SiCOH, SiLK, JSR, porous dielectric, etc.) is deposited atop the wafer. Embedded within dielectric layer 101 is a first level of metal wiring 102 (eg., Cu, Al, Al(Cu), W, etc.). Thereafter, a capping layer 103 (e.g., $Si_3N_4$, SiC, SiC(N,H), etc.) is formed over first dielectric layer 101 and a second dielectric layer 104 (e.g., $SiO_2$, $Si_3N_4$, SiCOH, SiLK, JSR, porous dielectrics, etc.) is formed over capping layer 103. A mask layer 105 (e.g., $SiO_2$, $Si_3N_4$, etc.) is then formed over second dielectric layer 104. As further shown in FIG. 3, portions of capping layer 103, second dielectric layer 104 and mask layer 105 have been etched to form via 100, which comes in contact with first level of metal wiring 102.

Figure 4:
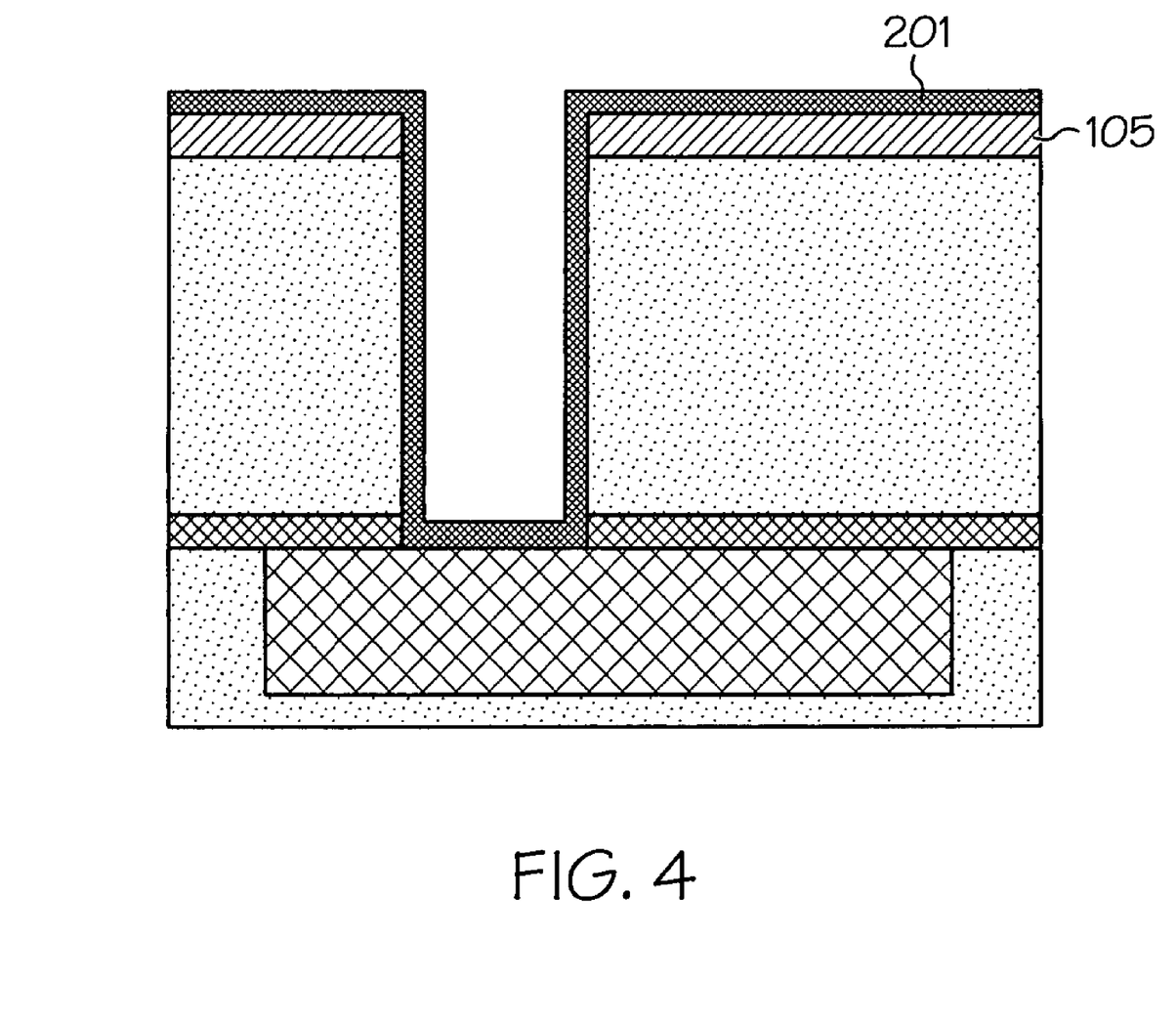
Figure 5A:
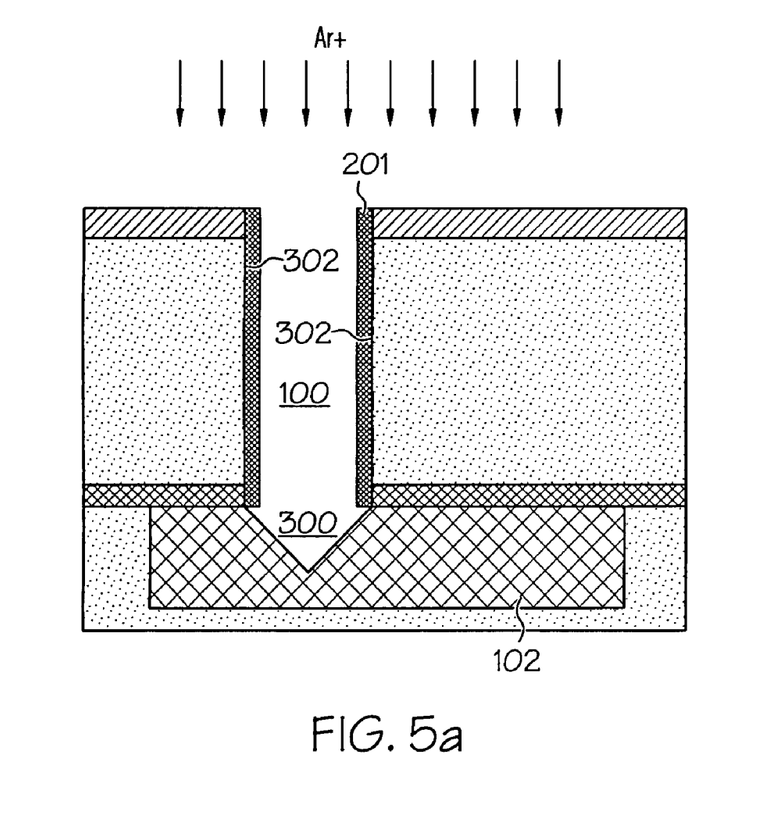
Figure 5B:
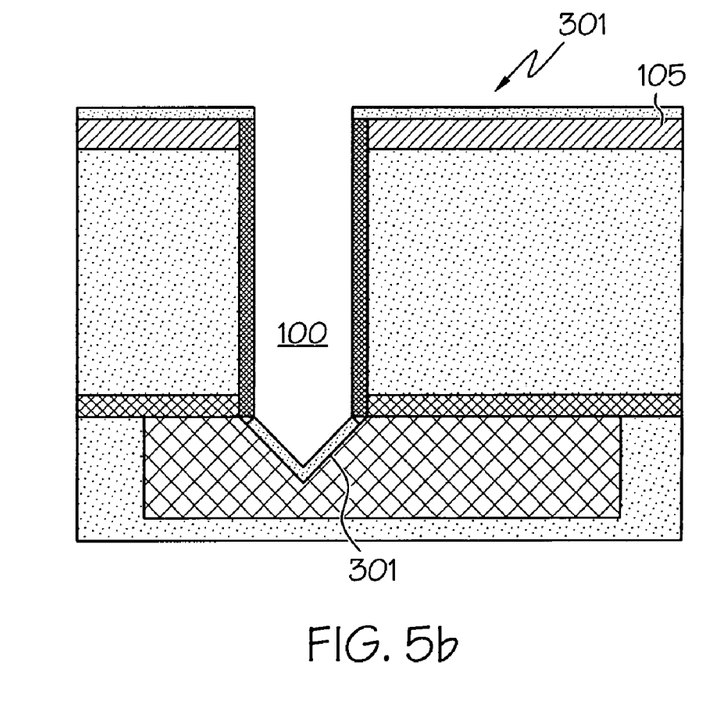

The process continues in FIG. 4. Specifically, a liner layer 201 (e.g., TaN, Ta, Ti, Ti(Si)N, Ru, W, Ir, $SiO_2$, $Si_3N_4$, SiC, SiC(N,H), etc.) is deposited over mask layer 105 through PVC, CVD, ALD or spin-on technology. In a typical embodiment, liner layer 201 is approximately 1 nm-10 nm. As shown in FIG. 5a, the structure is then exposed/bombarded with a gaseous ion plasma (e.g., Ar, He, Ne, Xe, $N_2$, $H_2$, $NH_3$, $N_2H_2$, etc.) to remove liner layer 201 from all surfaces of the structure with the exception of sidewalls 302 of via 100. This results in formation of a gouge 300 through/under via 100 and into first level of metal wiring 102. Thereafter, a thin metallic layer 301 (TaN, Ta, Ti, TiN, W, Ru, Ir, Au, Ag, etc.) can be optionally deposited over mask layer 105 and in gouge 300 as shown in FIG. 5b.

Figure 6:
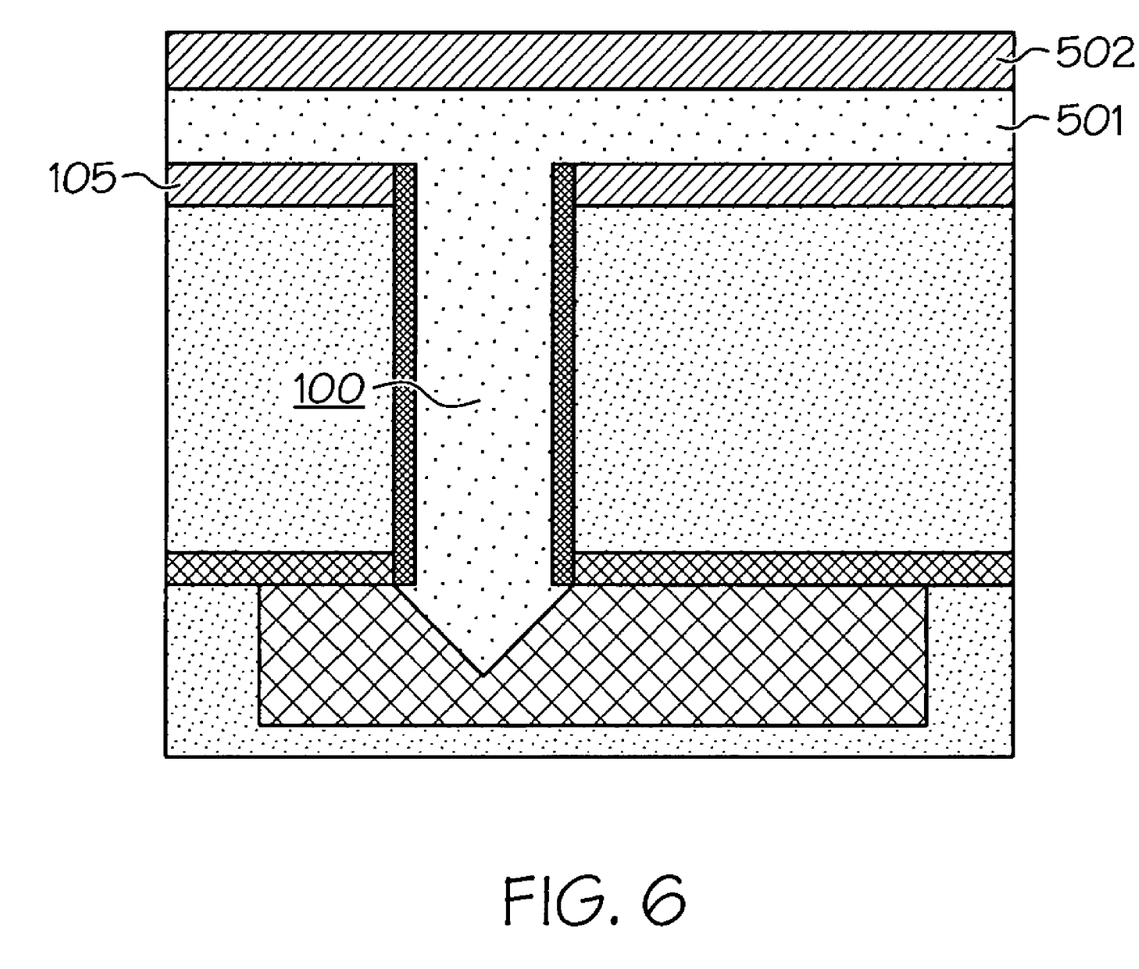

Referring now to FIG. 6, the formation process continues with the deposition of an organic planarizing material/layer 501. As shown in FIG. 6, organic planarizing layer 501 fills via 100 and covers the upper surface of mask layer 105. In general, any suitable deposition processes can be utilized in depositing the organic planarizing layer 501 such as spin-on deposition, CVD, PECVD, evaporation, chemical solution deposition, etc.

Once deposited, CMP or grinding can be used to planarize organic planarizing layer 501. It should be understood that organic planarizing layer 501 can comprise organic planarizing material including, for example, antireflective coatings, NFC and TDP which is commercially available from JSR, PN which is commercially available from Promerus, ODL which is commercially available from ShinEtsu, and NCA, and GF which is commercially available from Brewer. Regardless, after providing organic planarizing layer 501, an oxide layer 502 such as a low temperature oxide (LTO) is deposited. The thickness of the oxide layer 502 is typically from about 100 to about 2000 Å, with a thickness from about 400 to about 800 Å being more typical.

Figure 7:
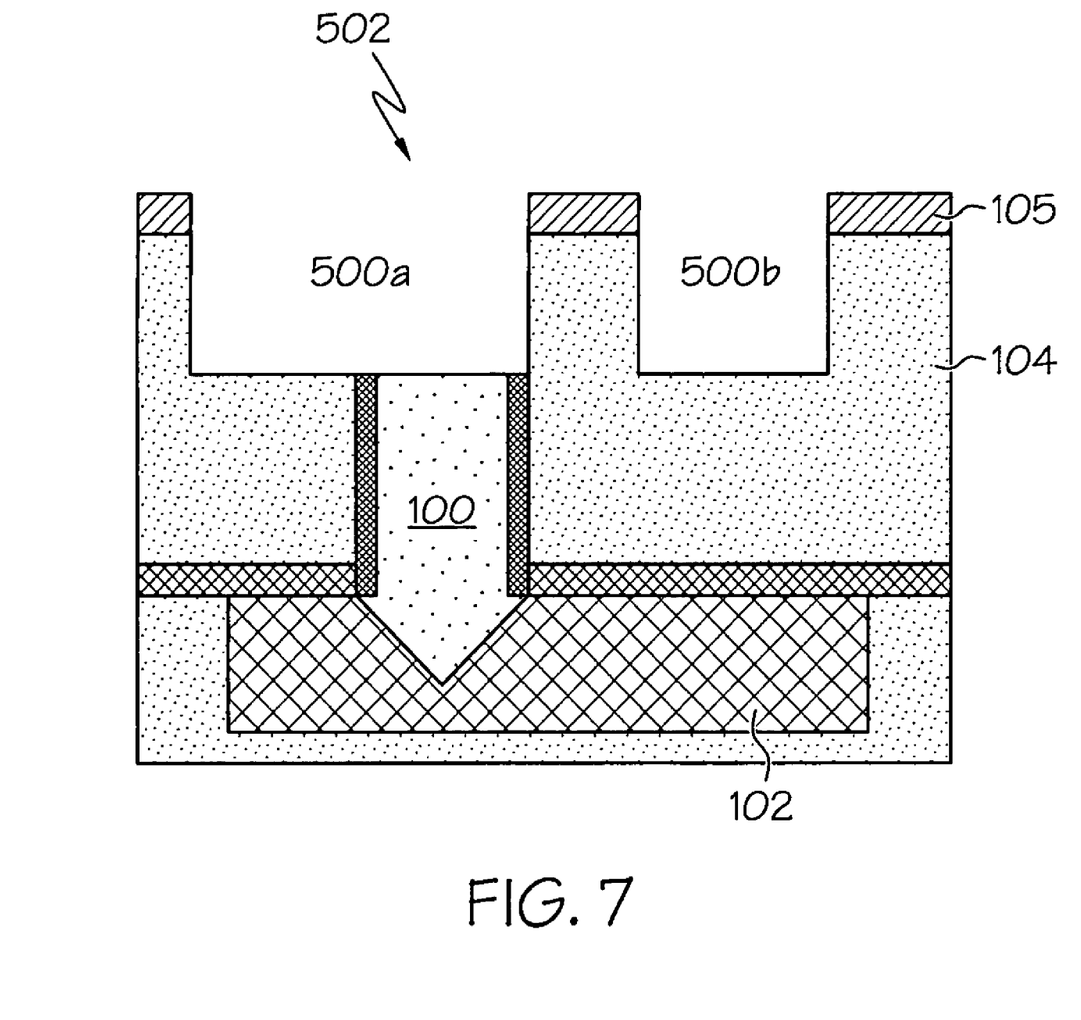

FIG. 7 shows the structure after two areas for building trenches 500a and 500b are formed. Specifically, trench areas 500a-b are formed by lithography and etching. In particular, a pattern mask (not shown) is formed that exposes portions of oxide layer 502. Then, etching such as Reactive Ion Etching (RIE) is used to "open" the oxide layer 502 expose portions of the underlying organic planarizing layer 501. It should be noted that trench areas 500a-b are typically located above portions of first level of metal wiring 102, and via 100. All these regions labeled as 100, 500a and 500b will become interconnects in an upper wiring/interconnect level. As further shown in FIG. 7, portions of layers 105 and 104 are etched to form trenches 500a-b. In general, the formation of a trench 500a over a via 100 as shown in FIG. 7 results in an aperture 502 within second dielectric layer in which trench 500a represents an upper line region and via 100 represent a lower via region. Under the present invention, an interconnect structure can be formed with one or more such apertures 502.

Figure 8:
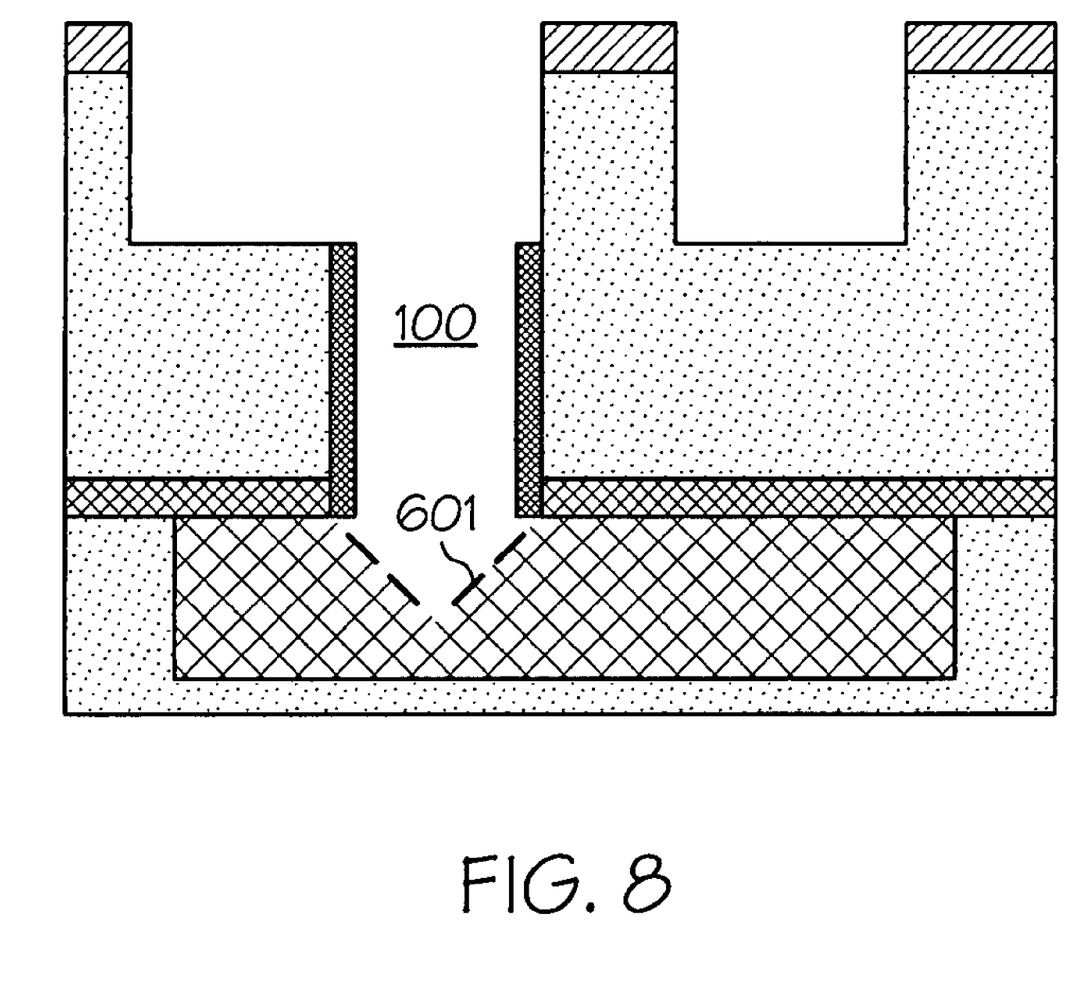
Figure 9:
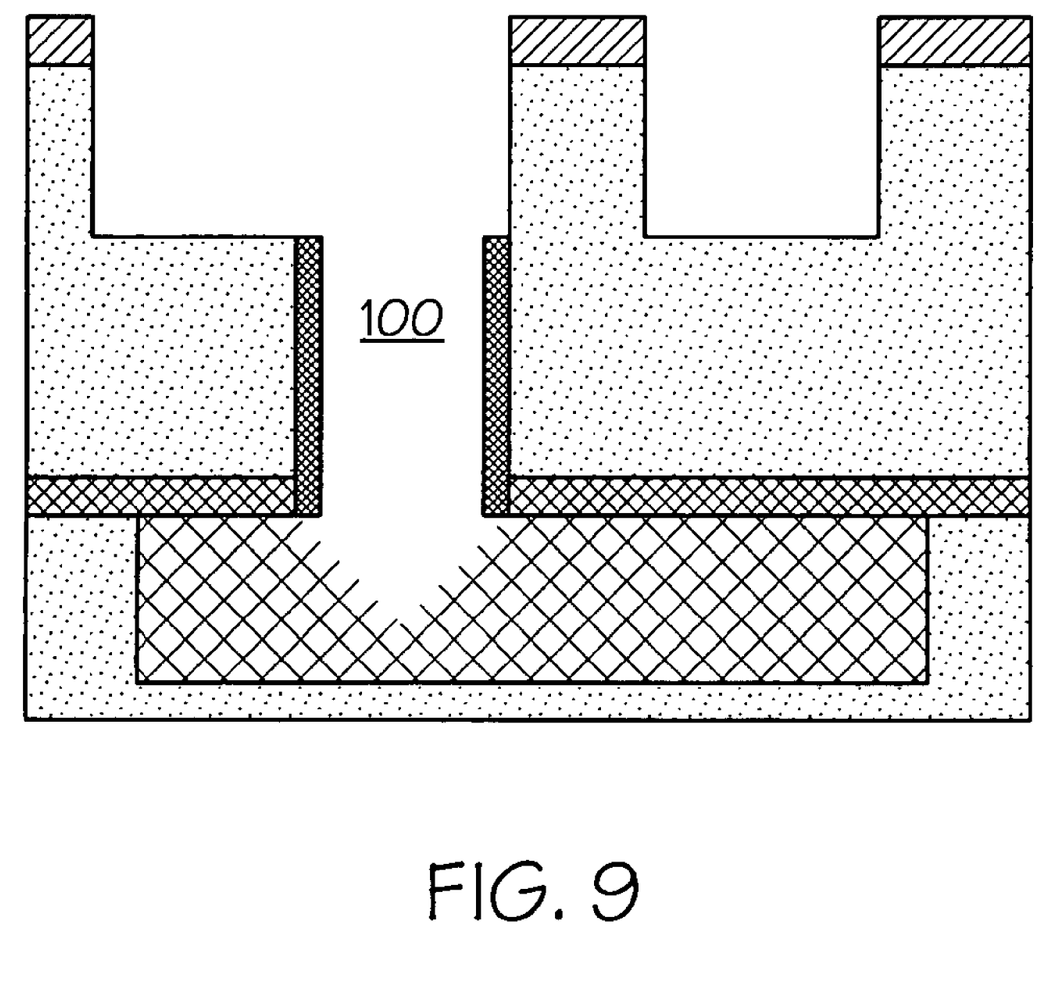
Figure 10:
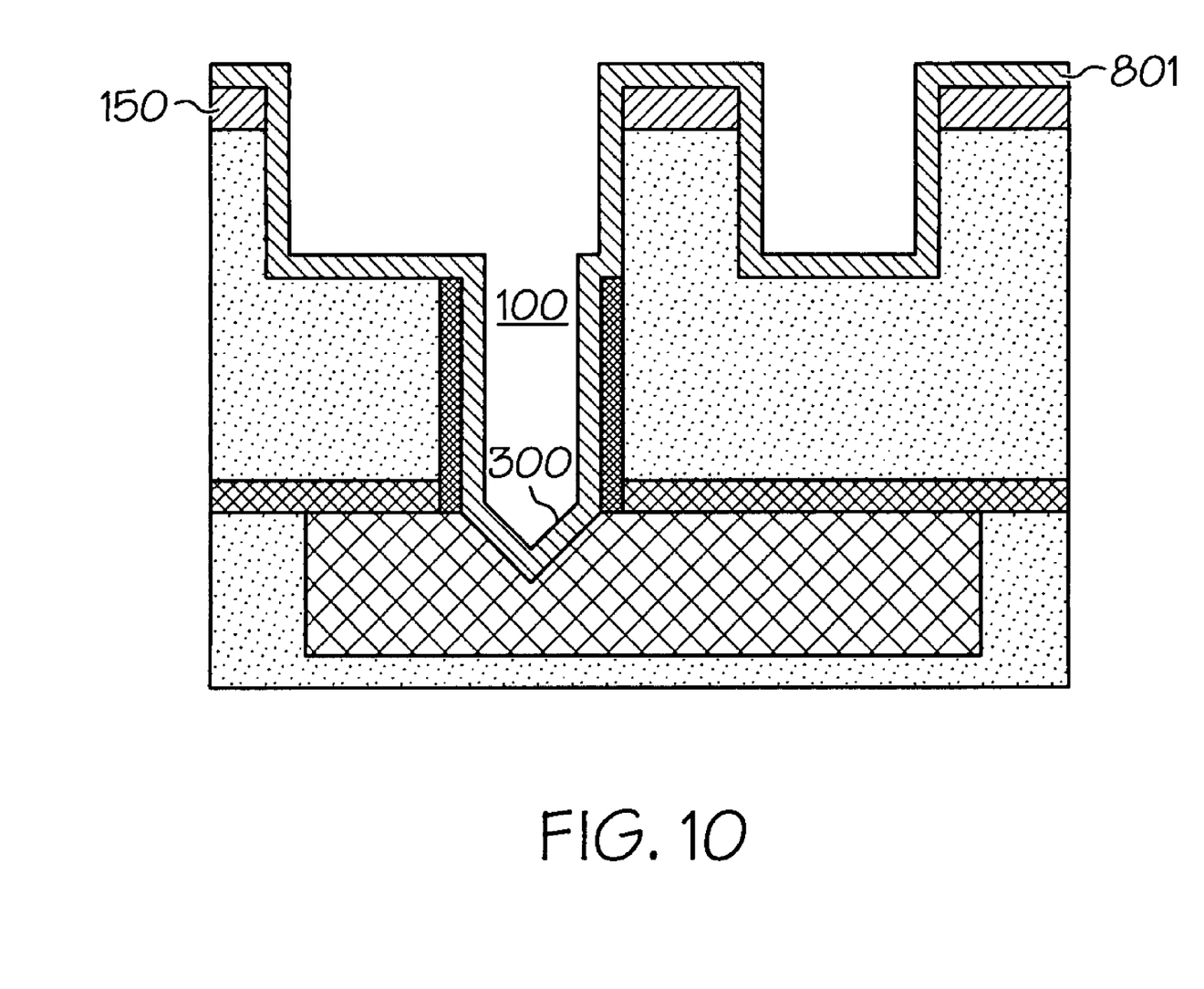
Figure 11:
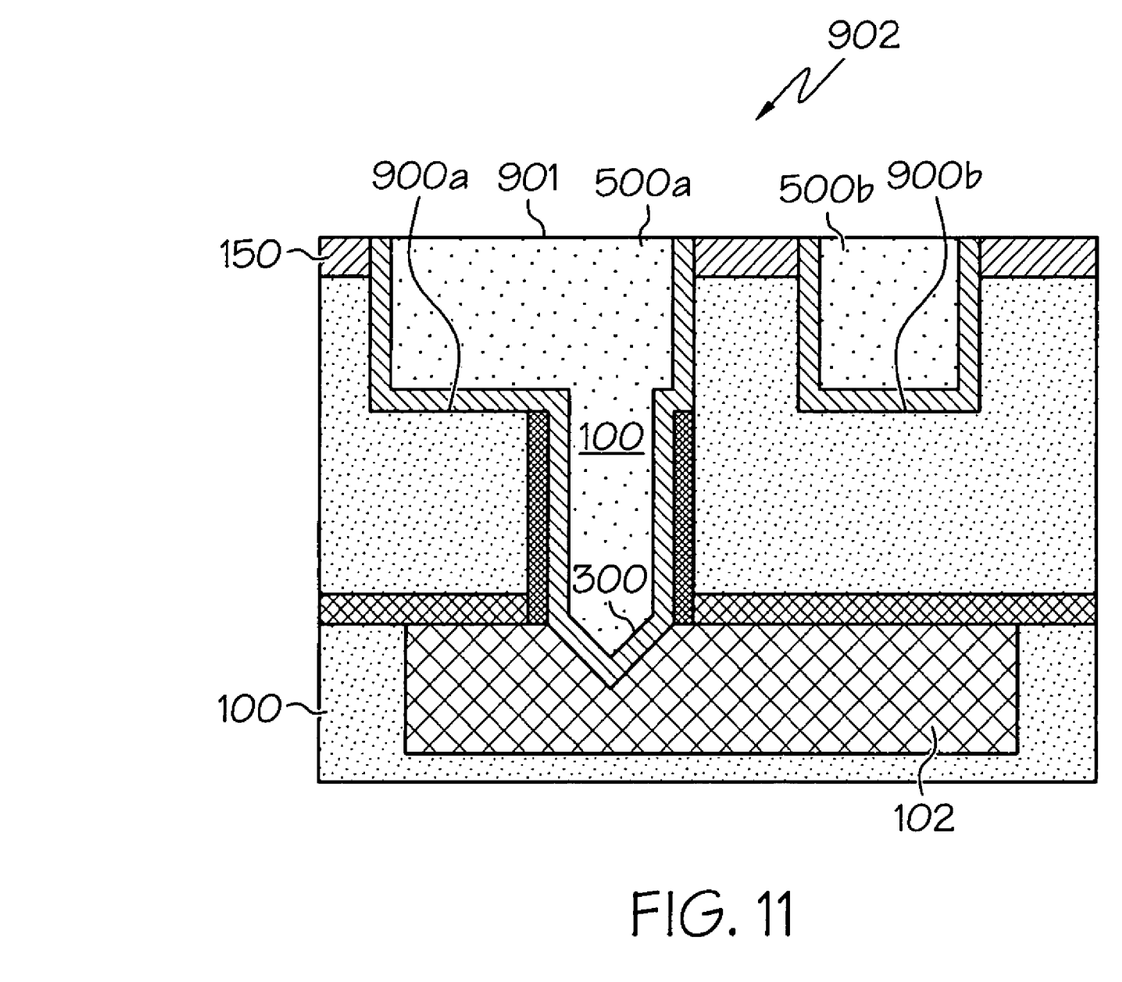

In any event, referring to FIG. 8, planarizing layer 501 deposited in FIG. 6 has been stripped out of via 100. However, there may still be oxide or residues 601 at bottom of via 100. In such an event, a wet clean and/or slight gaseous ion plasma bombardment can be performed to remove resides 601, as shown in FIG. 9. Once any such residues have been removed, the process continues in FIG. 10 with the depositing of a diffusion barrier layer(s) (e.g., TaN, Ta, Ti, TiN, W, Ru, Ir, etc.) and plating seed layer (e.g., Ru, Ir, Cu, Au, Ag, etc.) collectively shown as layer 801 over mask layer 105, and in via 100 and gouge 300. Once layer(s) 801 have been deposited, electrical conductive material deposition and polishing such as CMP can be performed to yield the interconnect structure 902 shown in FIG. 11. As can be seen, interconnect structure 902 includes a second level of metal wiring 901 (e.g., Cu, Al, Al(Cu), W, etc.) in trenches 500a-b and via 100. As further shown in FIG. 11, since trenches 500a-b were formed after gouge 300, bottom surfaces 900a-b of trenches 500a-b are smooth (i.e., have a roughness of less than approximately 20 nm, and preferably less than approximately 10 nm). In addition, under interconnect structure 902, the total liner thickness at the sidewalls of via 100 is thicker than the total liner thickness at the sidewall of trenches 500A-B.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

We claim:

1. A method for preventing trench damage during formation of an interconnect structure, comprising:
   forming a dielectric layer having a first level of metal wiring embedded therein;
   forming a second dielectric layer above the first dielectric layer;
   forming a via having sidewalls in the second dielectric layer and in contact with the first level of metal wiring;
   depositing a liner layer within the via and over the second dielectric layer;
   then, forming a punch-through type gouge under the via and into the first level of metal wiring and removing the liner layer within the punch-through type gouge and over the second dielectric layer; and
   then, forming a trench in the second dielectric layer after the punch-through type gouge has been formed, wherein the liner layer lines the sidewalls of the via and is not present in the punch-through type gouge and the trench.

2. The method of claim 1, further comprising:
   depositing a diffusion barrier layer and a plating seed layer above the second dielectric layer; and
   depositing an electrically conductive material above the plating seed layer and Polishing the interconnect structure to form a second level of metal wiring in the second dielectric layer.

3. The method of claim 2, the diffusion barrier layer being selected from the group consisting of TaN, Ta, Ti, Ti(Si)N, Ru, W, and Ir, the plating seed layer being selected from the group consisting of W, Cu, Al, Ru, Ir, and a material consisting of Al, Cu, and Si, and the electrically conductive material being selected from the group consisting of Cu, Al, W, and Al(Cu).

4. The method of claim 1, the step of forming the gouge comprising exposing the second dielectric layer to a gaseous ion plasma, the gaseous ion plasma being selected from the group consisting of Ar, He, Ne, Xe, $N_2$, $H_2$, $NH_3$, and $N_2H_2$.

5. The method of claim 1, the liner layer being selected from the group consisting of TaN, Ta, Ti, Ti(Si)N, Ru, W, Ir, $SiO_2$, $Si_3N_4$, SiC, and SiCH.

6. The method of claim 1, the second dielectric layer having at least one aperture that includes the via and the trench, the aperture having an upper line region and a lower via region.

7. The method of claim 1, the first dielectric layer and the second dielectric layer each having a dielectric constant of no greater than approximately 5.0.

8. A method for forming an interconnect structure, comprising:
   forming a first level of metal wiring in a first dielectric layer;
   forming a capping layer over the first dielectric layer;
   forming a second dielectric layer over the capping layer;
   applying a mask layer over the second dielectric layer;
   forming a via having sidewalls through the mask, the second dielectric layer and the capping layer;
   depositing a liner layer within the via and over the second dielectric layer;
   then, forming a punch-through type gouge in the via and removing the liner layer within the punch-through type gouge and over the second dielectric layer; and
   then, forming a trench in the second dielectric layer after the punch-through type gouge has been formed, wherein the liner layer lines the sidewalls of the via and is not present in the punch-through type gouge and the trench.

9. The method of claim 8, further comprising:
   depositing a diffusion barrier layer and a plating seed layer above the second dielectric layer; and
   depositing an electrically conductive material above the plating seed layer and polishing the interconnect structure to form a second level of metal wiring in the second dielectric layer.

10. The method of claim 9, the diffusion barrier layer being selected from the group consisting of TaN, Ta, Ti, Ti(Si)N, Ru, W, and Ir, the plating seed layer being selected from the group consisting of W, Cu, Al, Ru, Ir, and a material consisting of Al, Cu and Si, and the electrically conductive material being selected from the group consisting of Cu, Al, W, and Al(Cu).

11. The method of claim 8, the liner layer being selected from the group consisting of TaN, Ta, Ti, Ti(Si)N, Ru, W, Ir, $SiO_2$, $Si_3N_4$, SiC, and SiCH.

12. The method of claim 8, the step of forming the punch-through type gouge comprising bombarding the second dielectric layer with a gaseous ion plasma being selected from the group consisting of Ar, He, Ne, Xe, $N_2$, $H_2$, $NH_3$ or $N_2H_2$.

13. The method of claim 8, further comprising depositing a metallic layer over the mask and in the punch-through type gouge prior to forming the trench.

14. The method of claim 8, further comprising;
    depositing a planarizing layer in the via and over the mask layer, and an oxide layer over the planarizing layer, the step of forming the trench comprising etching the planarizing layer and the oxide layer; and
    stripping the planarizing layer from the via after the trench has been formed.

* * * * *